(12) United States Patent
Kawakami

(10) Patent No.: US 9,998,024 B2
(45) Date of Patent: Jun. 12, 2018

(54) POWER CONVERSION APPARATUS

(71) Applicant: MITSUBISHI ELECTRIC CORPORATION, Chiyoda-ku, Tokyo (JP)

(72) Inventor: Tomoyuki Kawakami, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 0 days. days.

(21) Appl. No.: 15/027,000

(22) PCT Filed: Oct. 2, 2014

(86) PCT No.: PCT/JP2014/076472
§ 371 (c)(1),
(2) Date: Apr. 4, 2016

(87) PCT Pub. No.: WO2015/083427
PCT Pub. Date: Jun. 11, 2015

(65) Prior Publication Data
US 2016/0241156 A1 Aug. 18, 2016

(30) Foreign Application Priority Data
Dec. 3, 2013 (JP) .................................. 2013-250347

(51) Int. Cl.
*B61D 27/00* (2006.01)
*H02M 7/04* (2006.01)
(Continued)

(52) U.S. Cl.
CPC .............. *H02M 7/04* (2013.01); *B61D 27/00* (2013.01); *H02M 3/04* (2013.01); *H02M 7/003* (2013.01); *H02M 7/44* (2013.01)

(58) Field of Classification Search
CPC . H02M 7/04; H02M 7/44; H02M 3/04; B61D 27/00
See application file for complete search history.

(56) References Cited

U.S. PATENT DOCUMENTS

| 4,795,859 A * | 1/1989 | Kato ..................... B60L 1/04 191/11 |
| 8,345,453 B2 * | 1/2013 | Itoh ..................... B60L 9/24 363/37 |

(Continued)

FOREIGN PATENT DOCUMENTS

| JP | 6-078562 A | 3/1994 |
| JP | 11-163545 A | 6/1999 |

(Continued)

OTHER PUBLICATIONS

International Search Report (PCT/ISA/210) dated Jan. 6, 2015, by the Japanese Patent Office as the International Searching Authority for International Application No. PCT/JP2014/076472.

(Continued)

*Primary Examiner* — Daniel Kessie
(74) *Attorney, Agent, or Firm* — Buchanan Ingersoll & Rooney PC

(57) ABSTRACT

A power converter of a power conversion apparatus includes any one or more of a functional module in which a rectifier unit rectifying an externally supplied alternating-current voltage and an inverter unit converting a direct-current voltage into alternating-current power are combined, a functional module in which a converter unit converting an alternating-current voltage into a direct-current voltage and an inverter unit converting a direct-current voltage converted by the converter unit into alternating-current power are combined, and a functional module in which an inverter unit converting a direct-current voltage into alternating- (Continued)

current power is provided. The functional module has a cooler cooling a semiconductor component.

4 Claims, 13 Drawing Sheets

(51) Int. Cl.
*H02M 7/00* (2006.01)
*H02M 3/04* (2006.01)
*H02M 7/44* (2006.01)

(56) References Cited

U.S. PATENT DOCUMENTS

| | | | | |
|---|---|---|---|---|
| 8,488,344 | B2* | 7/2013 | Kono | B60L 9/005 |
| | | | | 363/37 |
| 2002/0121811 | A1 | 9/2002 | Hashimoto et al. | |
| 2003/0161166 | A1* | 8/2003 | Mutoh | H02M 1/12 |
| | | | | 363/50 |
| 2004/0119439 | A1* | 6/2004 | Miettinen | H02M 5/16 |
| | | | | 318/803 |
| 2005/0265002 | A1* | 12/2005 | Armstrong | H05K 7/20909 |
| | | | | 361/719 |
| 2006/0273592 | A1* | 12/2006 | Yamabuchi | H02M 7/003 |
| | | | | 290/40 C |
| 2009/0101419 | A1 | 4/2009 | Okayama et al. | |
| 2010/0118569 | A1* | 5/2010 | Kono | H02M 7/53871 |
| | | | | 363/34 |
| 2010/0134979 | A1 | 6/2010 | Obiraki et al. | |
| 2011/0122669 | A1* | 5/2011 | Santos | H02M 7/003 |
| | | | | 363/141 |
| 2011/0176281 | A1 | 7/2011 | Ikemoto et al. | |
| 2014/0028091 | A1* | 1/2014 | Yoshimura | B60L 1/06 |
| | | | | 307/9.1 |
| 2014/0345492 | A1 | 11/2014 | Fujito et al. | |
| 2015/0062819 | A1* | 3/2015 | Oughton, Jr. | H01L 23/3672 |
| | | | | 361/700 |

FOREIGN PATENT DOCUMENTS

| | | |
|---|---|---|
| JP | 2003-235112 A | 8/2003 |
| JP | 2004-087711 A | 3/2004 |
| JP | 2004-201500 A | 7/2004 |
| JP | 2004-328838 A | 11/2004 |
| JP | 2009-201213 A | 9/2009 |
| JP | 2010-129867 A | 6/2010 |
| JP | 4519200 B2 | 8/2010 |
| JP | 2013-163503 A | 8/2013 |
| WO | WO 2007/138645 A | 12/2007 |
| WO | WO 2010/041339 A1 | 4/2010 |

OTHER PUBLICATIONS

Written Opinion (PCT/ISA/237) dated Jan. 6, 2015, by the Japanese Patent Office as the International Searching Authority for International Application No. PCT/JP2014/076472.

Office Action (Notice of Reason for Rejection) dated Dec. 6, 2016, by the Japanese Patent Office in corresponding Japanese Patent Application No. 2015-551415, and an English Translation of the Office Action. (6 pages).

The extended European Search Report dated Aug. 3, 2017, by the European Patent Office in corresponding European Patent Application No. 14867958.2-1804. (8 pages).

Notice of Reasons for Refusal dated Jan. 12, 2018 by the People's Republic of China State Intellectual Property Office in corresponding Chinese Patent Application No. 201480066257.5 (12 pages).

* cited by examiner

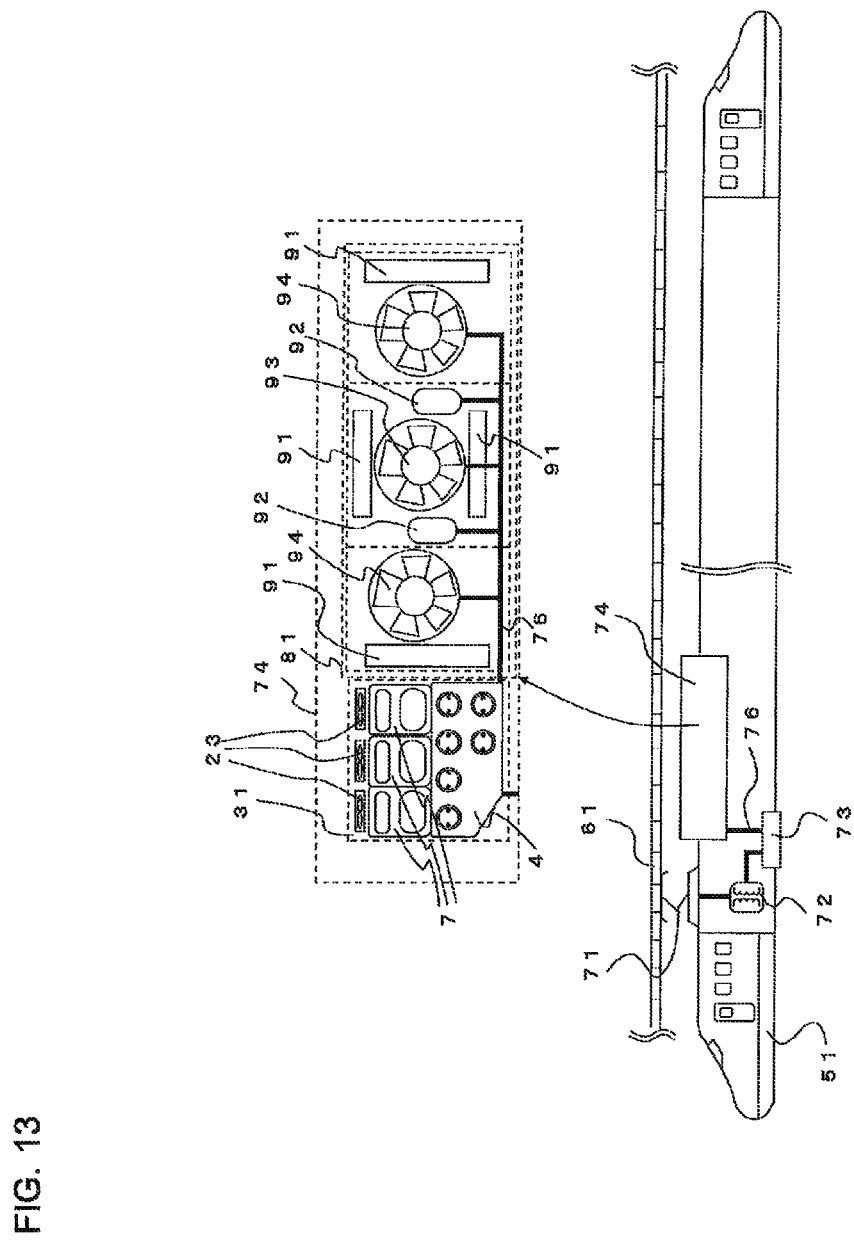

POWER CONVERSION APPARATUS

TECHNICAL FIELD

The present invention relates to a power conversion apparatus that performs power conversion by using semiconductor components.

BACKGROUND ART

An existing power conversion apparatus provided in a railway vehicle includes a heat generating section having various semiconductor units, and a heat radiating section cooling the heat generating section. The heat generating section and the heat radiating section are configured to be able to be separated, and thus the power conversion apparatus in which workability of assembly and maintainability are improved has been proposed (see Patent Literature 1, for example).

CITATION LIST

Patent Literature

Patent Literature 1: Japanese Unexamined Patent Application Publication No. 2003-235112 (paragraph [0012])

SUMMARY OF INVENTION

Technical Problem

In some regions, a power conversion apparatus used in a railway vehicle is required to be design to adapt to a plurality of different power sources in different regions that are derived from a difference between a direct current and an alternating current, or a difference between a single-phase alternating current and a three-phase alternating current, for example. The power conversion apparatus disclosed in Patent Literature 1 has a structure in which semiconductor components are mounted on one substrate so that a necessary power conversion characteristic is satisfied. Hence, the entire power conversion apparatus has to be reassembled.

The present invention has been made to solve the above-described problem, and an object thereof is to provide a power conversion apparatus that enables shared use of semiconductor components to be made and a reduction in reliability to be prevented.

Solution to Problem

A power conversion apparatus according to the present invention is a power conversion apparatus providing a supply to an air-conditioning apparatus provided in a railway vehicle, and includes a power converter including a functional module in which a power conversion unit constituted by a semiconductor component and configured to convert power is mounted. The power converter includes any one or more of a functional module in which a rectifier unit rectifying an externally supplied alternating-current voltage and an inverter unit converting a direct-current voltage into alternating-current power are combined, a functional module in which a converter unit converting an alternating-current voltage into a direct-current voltage and an inverter unit converting a direct-current voltage converted by the converter unit into alternating-current power are combined, and a functional module in which an inverter unit converting a direct-current voltage into alternating-current power is provided. The functional module has a cooler cooling the semiconductor component.

Advantageous Effects of Invention

According to the power conversion apparatus of the present invention, when the power converter is constituted by a combination of functional modules so that necessary capacity is provided, shared use of semiconductor components is promoted, and thus a reduction in reliability due to an increase in the number of semiconductor components can be prevented.

BRIEF DESCRIPTION OF DRAWINGS

FIG. 13 illustrates an example of a railway vehicle 51 in which the power conversion apparatus 2 is installed in Embodiment 3 of the present invention.

DESCRIPTION OF EMBODIMENTS

Figure 1:
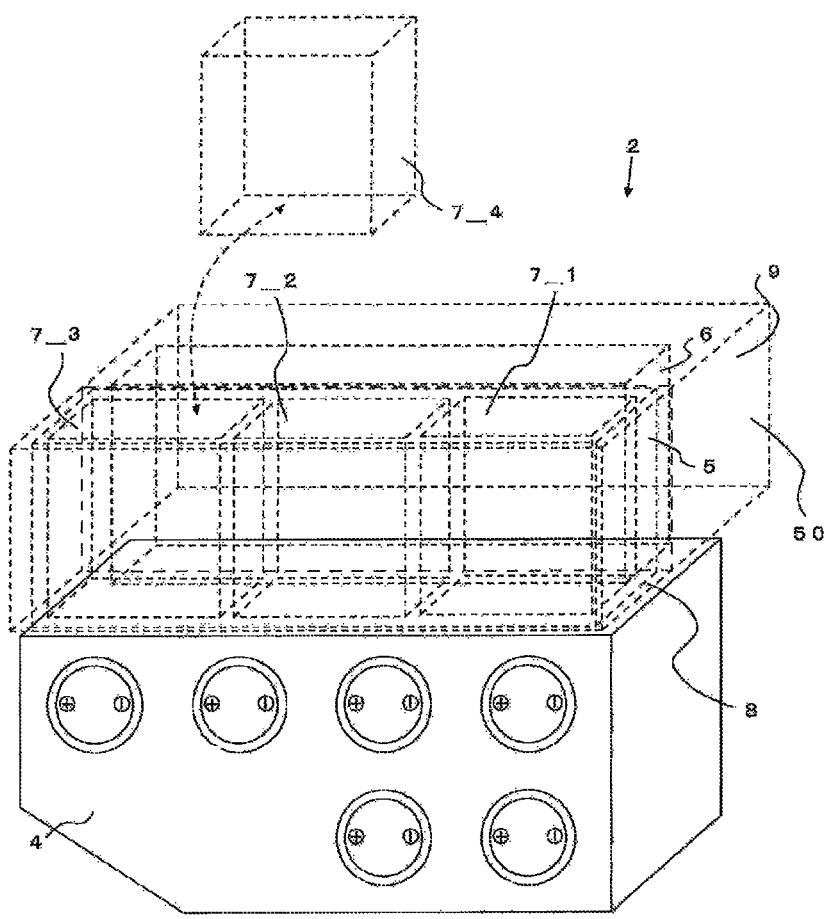
FIG. 1 illustrates an example of an arrangement configuration of functional modules 7 in Embodiment 1 of the present invention.

Embodiments of the present invention will be described in detail below with reference to the drawings. Note that, in Embodiments 1 to 4, elements not specifically described are common to Embodiments 1 to 4, and the same functions and configurations will be described using the same reference numerals.

Embodiment 1

Configuration in Embodiment 1

Figure 2:
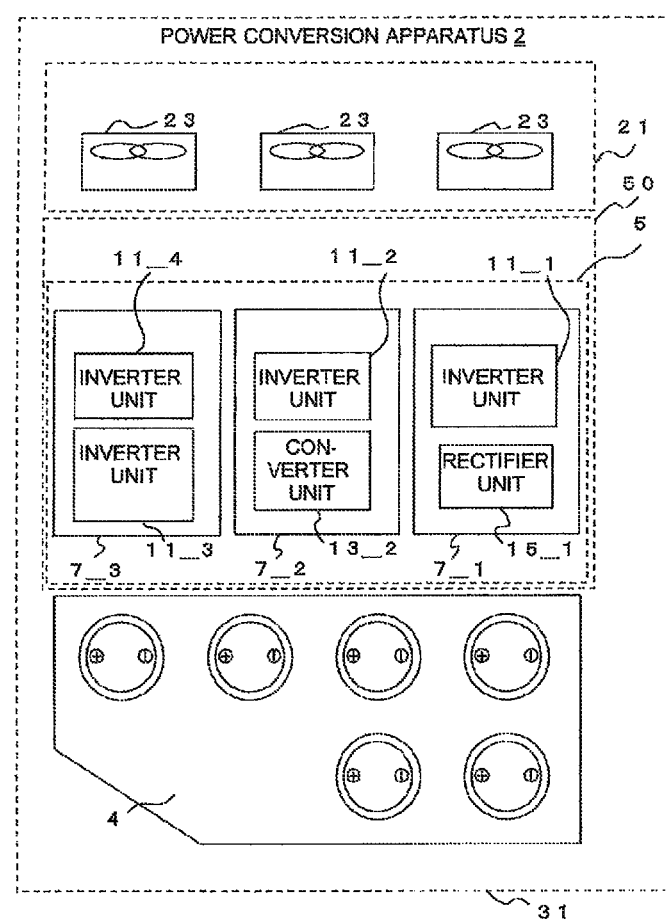
FIG. 2 illustrates an example of a functional configuration of a power conversion apparatus 2 in Embodiment 1 of the present invention.

FIG. 1 illustrates an example of an arrangement configuration of functional modules in a power conversion apparatus in Embodiment 1 of the present invention. FIG. 2 illustrates an example of a functional configuration of the power conversion apparatus in Embodiment 1 of the present invention. As illustrated in FIGS. 1 and 2, a power conversion apparatus 2 includes a cooling fan unit 21, a capacitor unit 4, and a power converter 5. The cooling fan unit 21 includes a plurality of cooling fans 23. The power converter 5 is accommodated in an accommodating section 50, and a closed chamber 8 and an open chamber 9 are accommodated in the accommodating section 50. The closed chamber 8 is an enclosed space that is closed off from the outside. The open chamber 9 is a space with an opening that communicates with outside air. A cooler 6 is disposed in the open chamber 9. The power converter 5 is disposed in the closed chamber 8, protection against dust and protection against water are achieved, and thus, in particular, iron dust or other dust is prevented from entering into a functional module because of a railway vehicle and resulting in deterioration of the functional module.

The power converter 5 includes a functional module 7_1, a functional module 7_2, and a functional module 7_3. In each functional module, one or more power conversion units configured to convert power are formed, the one or more power conversion units are each constituted by a semiconductor component. Note that the functional module 7_1 to the functional module 7_3 are each provided on the capacitor unit 4 in such a manner as to be demountable from the capacitor unit 4. For example, the functional module 7_3 can be replaced with a fourth functional module 7_4 having another power conversion characteristic when necessary. Although the case where the power converter 5 includes three functional modules 7_1 to 7_3 is illustrated, the number and shapes of functional modules are not limited to particular number and shapes, and it is only necessary that the number be one or more.

The functional module 7_1 includes a rectifier unit 15_1 that rectifies an externally supplied alternating-current voltage, and an inverter unit 11_1 that converts a direct-current voltage converted by the rectifier unit 15_1 into alternating-current power. The rectifier unit 15_1 converts single-phase or three-phase alternating-current power into a direct-current voltage. The inverter unit 11_1 converts the direct-current voltage converted by the rectifier unit 15_1 into predetermined three-phase alternating-current power.

The functional module 7_2 includes a converter unit 13_2 that converts an externally supplied varying input voltage into a stable direct-current voltage, and an inverter unit 11_2 that converts the direct-current voltage converted by the converter unit into alternating-current power. The converter unit 13_2 converts a varying input voltage into a stable direct-current voltage. The inverter unit 11_2 converts the direct-current voltage converted by the converter unit 13_2 into predetermined three-phase alternating-current power.

The functional module 7_3 includes a plurality of inverter units 11_3 and 11_4 that each convert a direct-current voltage into alternating-current power. The inverter unit 11_3 and the inverter unit 11_4 each convert a direct-current voltage into predetermined three-phase alternating-current power. Although the functional module 7_3 in which two inverter units 11_3 and 11_4 are used is illustrated, a functional module can be constituted by arranging three inverter units as long as the functional module is nearly uniform with the other functional modules in the amount of heat generated and the size. Although a functional module can be constituted by one inverter unit if the capacity of the inverter unit is large, the functional module is constituted by typically a plurality of, preferably two inverter units.

Here, the converter unit 13_2 and the inverter units 11_1 to 11_3 are constituted by an IGBT (Insulated Gate Bipolar Transistor) with which a diode is connected in anti-parallel, a MOSFET (Metal Oxide Semiconductor Field Effect Transistor) in which a diode is disposed between a source and a drain, or a mechanical switch, for example. Note that, in addition to the above-described devices, the converter unit 13_2 and the inverter units 11_1 to 11_3 may be constituted by, for example, SiC.

Furthermore, as illustrated in FIG. 2, in the power converter 5, a plurality of functional modules 7_1 to 7_3 can each be formed and separated as an independent module, and are demountable. Specifically, the functional modules 7_1 to 7_3 are each fastened to the capacitor unit 4 by using, for example, screws, and demounting can be performed for each of the functional modules 7_1 to 7_3 for maintenance or replacement. For this reason, maintenance, inspections, and replacement, for example, can be carried out for each of the functional modules 7_1 to 7_3 even in the case of a breakdown of a device, and thus shared use of structural components can be made, and also maintenance costs can be reduced.

Furthermore, in each of the functional modules 7_1 to 7_3, the sizes of power conversion units are designed. For example, in each of the functional modules 7_1 to 7_3, by providing a large power conversion unit and a small power conversion unit, the amounts of heat generated from the respective power conversion units are distributed for each of the functional modules 7_1 to 7_3, thus resulting in a situation in which the amount of heat generated per each of the functional modules 7_1 to 7_3 is spread.

That is, in the functional modules 7_1 to 7_3, various power conversion units constituting the inverter units 11_1 to 11_4 are arranged on the basis of the arrangement and number thereof in which the amounts of heat generated are distributed. With this configuration, in each of the functional modules 7_1 to 7_3, distribution of heat generation with less unevenness is achieved, and thus temperature distribution is balanced. In other words, when the amounts of heat generated are distributed in each of the functional modules 7_1 to 7_3, the amount of heat generated in each of the functional modules 7_1 to 7_3 is spread, thus resulting in a situation in which the amounts of heat generated in the respective functional modules 7_1 to 7_3 are nearly evenly balanced. As a result, the levels of cooling air necessary for the respective functional modules 7_1 to 7_3 may be equal. Hence, the cooling fans 23 of the same specifications can cool the respective functional modules 7_1 to 7_3.

Additionally, external dimensions of the respective functional modules 7_1 to 7_3 are nearly equal. Furthermore, inside the functional modules 7_1 to 7_3, the power conversion units are arranged so that the length of a conductor line providing a connection between power conversion units is reduced and the number of bends is reduced. Hence, a wiring structure W that reduces wiring losses is achieved. For example, in the inverter unit 11_1 to the inverter unit 11_4, the inverter units 11_1 to 11_4 are arranged so that the wiring structure is straight wiring. In other words, in the functional modules 7_1 to 7_3, conductors connecting semiconductor components are provided at locations facing each other. For this reason, a line providing a connection between the conductors is disposed linearly, and thus wiring losses can be reduced. Note that, since conductors connecting semiconductor components are located so that they face each other, the conductors are preferably provided so that their height positions are equal. As a result, the power conversion apparatus 2 enables assembly work of the power conversion units to be simplified and also a reduction in wiring inductance.

As described above, in the power converter 5 of the power conversion apparatus 2, structural components are separated into the plurality of functional modules 7_1 to 7_3, and thus the power converter 5 is constituted by a combination of the plurality of functional modules 7_1 to 7_3. Hence, the power converter 5 enables the structural components to be separated into the plurality of functional modules 7_1 to 7_3 even in the case of a breakdown of a device, and thus maintenance, inspections, and replacement, for example, can be carried out for each of the functional modules 7_1 to 7_3. As a result, the power conversion apparatus 2 enables shared use of the structural components and also a reduction in maintenance costs.

Furthermore, in the power conversion apparatus 2, even in the case where a combination of the plurality of functional modules is changed in response to a power source, the sharable functional modules 7_1 to 7_3 can be shared even in the case of any power source. As a result, a reduction in reliability due to an increase in the number of semiconductor components can be prevented.

That is, electricity is supplied to a railway vehicle from an overhead line via a pantograph. Examples of power supplied to the power conversion apparatus 2 from the overhead line include various types, such as DC 600 V, DC 750 V, DC 1500 V, AC 20 kV, and AC 25 kV, from region to region. Hence, the power converter 5 has to have a power conversion characteristic that matches the type of power supplied from the overhead line. As in the related art, in the case of a structure in which semiconductor components are mounted on one substrate so that a necessary power conversion characteristic is satisfied, for example, a different type of power converter 5 has to be produced for each of requirements varying between, for example, regions where a railway vehicle runs, resulting in an increase in costs and also taking time and effort in maintenance. Meanwhile, in the case of a power conversion apparatus that can respond to all the above-described types of power, an increase in the size of a power converter makes it difficult to secure an installation space in a railway vehicle, and also an increase in the number of components reduces reliability. Thus, in the power converter 5 constituted by the functional modules 7_1 to 7_3 that can be recombined, the sharable functional modules 7_1 to 7_3 are shared even in the case of any power source, and thus a reduction in reliability due to an increase in the number of semiconductor components can be prevented.

Figure 3A:
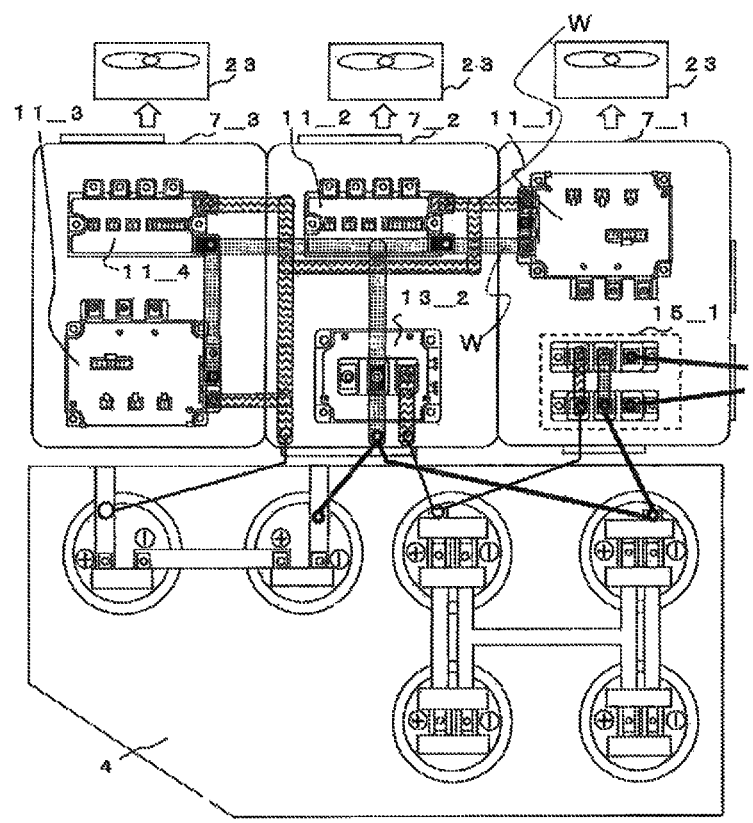
FIG. 3A illustrates an example of a power converter constituted by three functional modules 7_1 to 7_3.
Figure 3B:
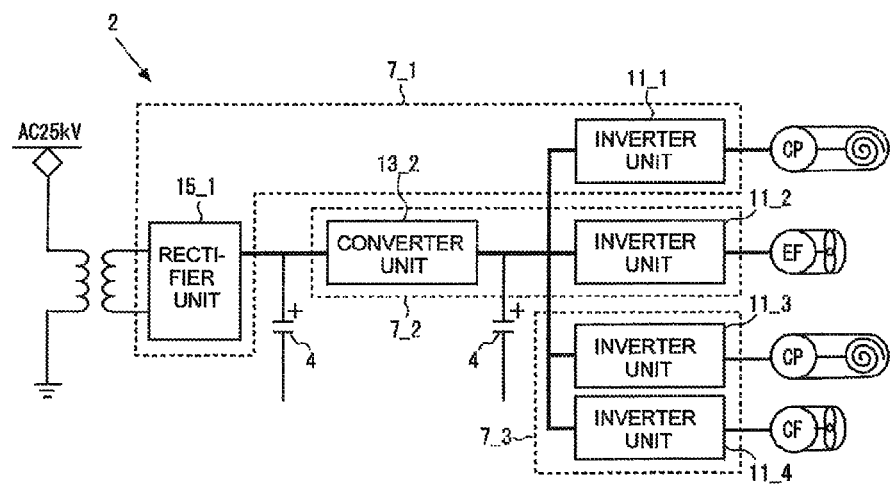
FIG. 3B illustrates an example of the power converter constituted by the three functional modules 7_1 to 7_3.

Specifically, the power converter 5 is constituted by at least one of the functional modules 7_1 to 7_3 selected from among three functional modules 7_1 to 7_3 in response to input power. FIGS. 3A and 3B each illustrate an example of the power converter constituted by three functional modules 7_1 to 7_3, and FIGS. 4A and 4B each illustrate an example of the power converter constituted by two functional modules 7_1 and 7_2. FIGS. 5A and 5B each illustrate an example of the power converter constituted by one functional module 7_1.

The power converter 5 illustrated in FIGS. 3A and 3B is constituted by a combination of three functional modules 7_1 to 7_3, converts an alternating-current voltage of 25 kV, and supplies power to compressors CPs, an outdoor air-sending device CF, an indoor air-sending device EF, and the capacitor unit 4.

Figure 3C:
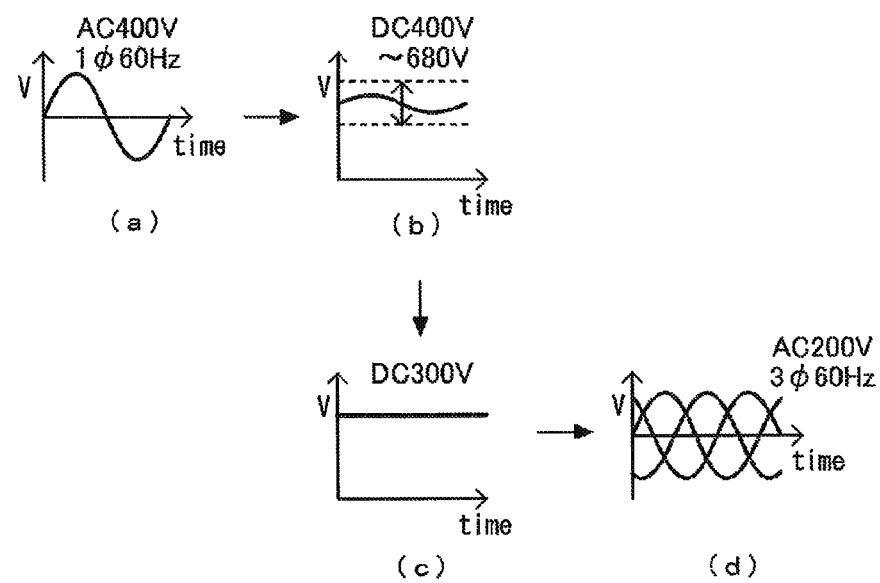
FIG. 3C includes graphs illustrating a situation in which power is converted in the power converter 5 illustrated in FIGS. 3A and 3B.

FIG. 3C includes graphs illustrating a situation in which power is converted in the power converter 5 illustrated in FIGS. 3A and 3B. The rectifier unit 15_1 of the functional module 7_1 rectifies externally input single-phase alternating-current power (see FIG. 3C(a)) into direct-current power (see FIG. 3C(b)), and outputs the direct-current power to the capacitor unit 4 that stores direct-current power, and the converter unit 13_2 of the functional module 7_2. The converter unit 13_2 of the functional module 7_2 converts the voltage rectified in the rectifier unit 15_1 into a stable direct-current voltage (see FIG. 3C(c)). The direct-current voltage stabilized in the converter unit 13_2 is converted into an alternating-current voltage in each of the inverter units 11_1 to 11_3 of the functional modules 7_1 to 7_3 (see FIG. 3C(d)), and loads, such as the compressors CPs, the outdoor air-sending device CF, and the indoor air-sending device EF, are actuated.

Figure 4A:
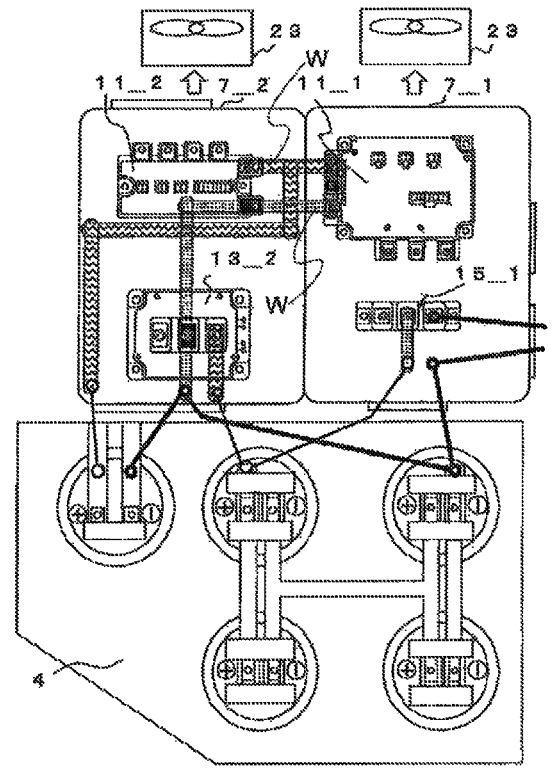
FIG. 4A illustrates an example of the power converter constituted by two functional modules 7_1 and 7_2.
Figure 4B:
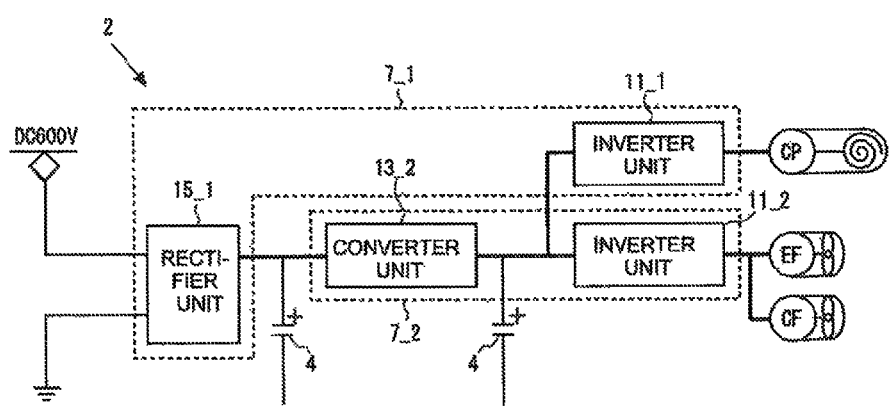
FIG. 4B illustrates an example of the power converter constituted by the two functional modules 7_1 and 7_2.
Figure 5A:
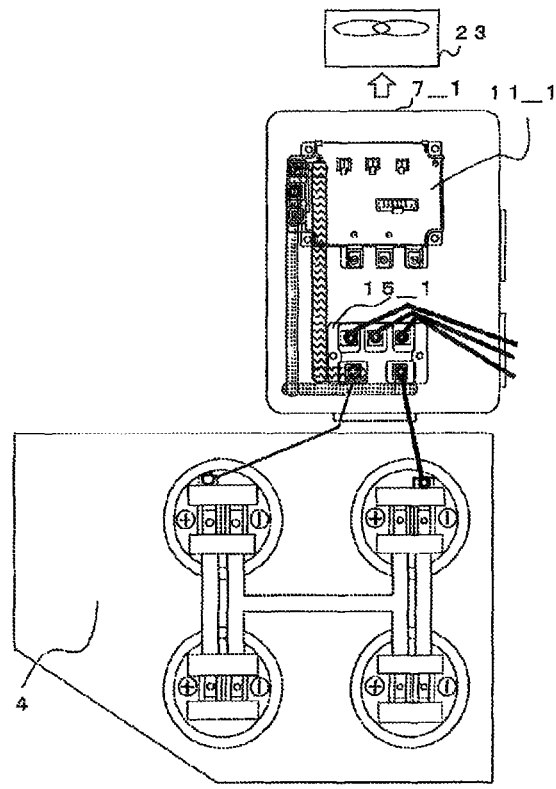
FIG. 5A illustrates an example of the power converter constituted by one functional module 7_1.
Figure 5B:
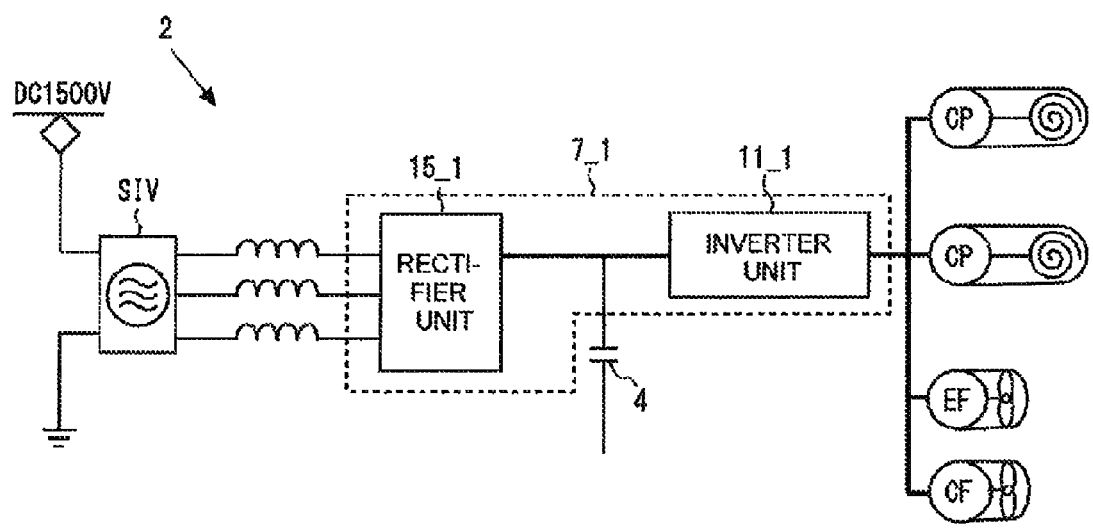
FIG. 5B illustrates an example of the power converter constituted by the one functional module 7_1.

The power converter 5 illustrated in FIGS. 4A and 4B is constituted by a combination of two functional modules 7_1 and 7_2, converts a direct-current voltage of 600 V, and provides a supply to a compressor CP, the outdoor air-sending device CF, the indoor air-sending device EF, and the capacitor unit 4.

Note that, although a direct-current voltage is supplied to the power converter 5, it is not necessarily a stable direct-current voltage, and fluctuates in some cases, and thus the power converter 5 is constituted by a combination of the functional modules 7_1 and 7_2 that respectively include the rectifier unit 15_1 and the converter unit 13_2. Furthermore, FIG. 4C includes graphs illustrating a situation in which power is converted in the power converter 5 illustrated in FIGS. 4A and 4B.

Figure 4C:
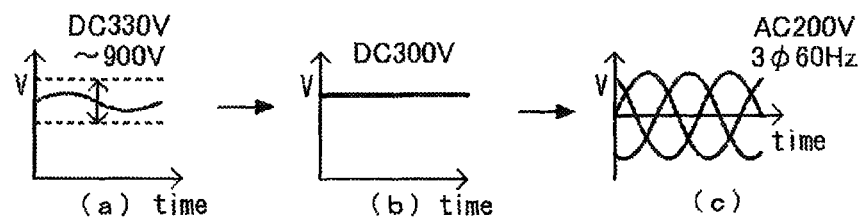
FIG. 4C includes graphs illustrating a situation in which power is converted in the power converter 5 illustrated in FIGS. 4A and 4B.

The rectifier unit 15_1 of the functional module 7_1 rectifies externally input direct-current power (see FIG. 4C(a)), and outputs the rectified power to the capacitor unit 4 that stores direct-current power, and the converter unit 13_2 of the functional module 7_2. The converter unit 13_2 of the functional module 7_2 converts the voltage rectified in the rectifier unit 15_1 into a stable direct-current voltage (see FIG. 4O(b)). The direct-current voltage stabilized in the converter unit 13_2 is converted into an alternating-current voltage in each of the inverter units 11_1 and 11_2 of the respective functional module 7_1 and 7_2 (see FIG. 4C(c)), and loads, such as the compressor CP, the outdoor air-sending device CF, and the indoor air-sending device EF, are actuated.

The power converter 5 illustrated in FIGS. 5A and 5B is constituted by one functional module 7_1, and an alternating-current voltage converted from a direct-current voltage of 1500 V via a static inverter SIV is input to the power converter 5. Then, the power converter 5 converts the input voltage, and supplies power to compressors CPs, the outdoor air-sending device CF, the indoor air-sending device EF, and the capacitor unit 4. Furthermore, FIG. 5C includes graphs illustrating a situation in which power is converted in the power converter 5 illustrated in FIGS. 5A and 5B.

Figure 5C:
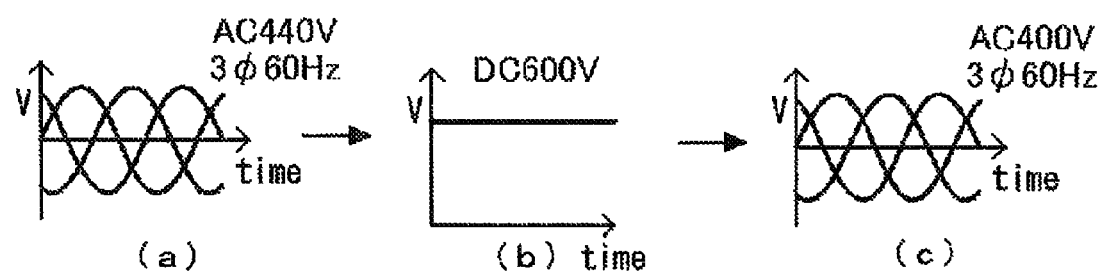
FIG. 5C includes graphs illustrating a situation in which power is converted in the power converter 5 illustrated in FIGS. 5A and 5B.

The rectifier unit 15_1 of the functional module 7_1 rectifies alternating-current power input from the static inverter SIV (see FIG. 50(*a*)), and outputs the rectified power to the capacitor unit 4 that stores direct-current power, and the inverter unit 11_1 of the functional module 7_1 (see FIG. 5C(b)). The direct-current voltage rectified in the rectifier unit 15_1 is converted into an alternating-current voltage in the inverter unit 11_1 of the functional module 7_1 (see FIG. 5C(c)), and loads, such as the compressors CPs, the outdoor air-sending device CF, and the indoor air-sending device EF, are actuated.

Thus, the power converter 5 can be constituted by varying combinations of the functional modules 7_1 to 7_3 so that each combination matches the type of power supplied from the overhead line. Hence, the sharable functional modules 7_1 to 7_3 are shared even in the case of any power source, and thus a reduction in reliability due to an increase in the number of semiconductor components can be prevented.

Figure 12:
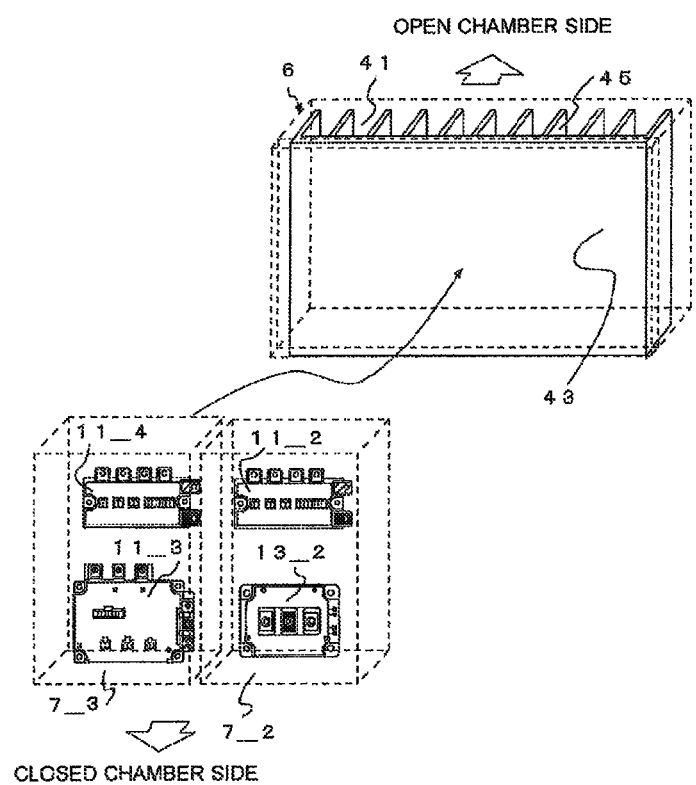
FIG. 12 illustrates an example of a location relationship between functional modules 7 and the cooler 6 in Embodiment 2 of the present invention.

Furthermore, the functional modules 7_1 to 7_3 have the cooler 6 configured to transfer heat generated from semiconductor components. The cooler 6 is constituted by, for example, a heat sink, and includes, as illustrated in FIG. 12, a heat receiving section (base plate) 43 that is in contact with semiconductor components of the functional modules 7_1 to 7_3, and a heat radiating section (heat radiating fins) 41 that is formed integrally with the heat receiving section and transfers heat conducted from the heat receiving section. Note that the cooler 6 may be provided for each of the functional modules 7_1 to 7_3, or one cooler 6 may be provided for a combination of the functional modules 7_1 to 7_3 as a whole. On this occasion, in the power conversion apparatus 2, there are achieved the number and arrangement configuration of power conversion units in which the amounts of heat generated in the respective functional modules 7_1 to 7_3 are spread so that they are balanced, thus enabling simplification of the configuration of the cooler 6.

Figure 6:
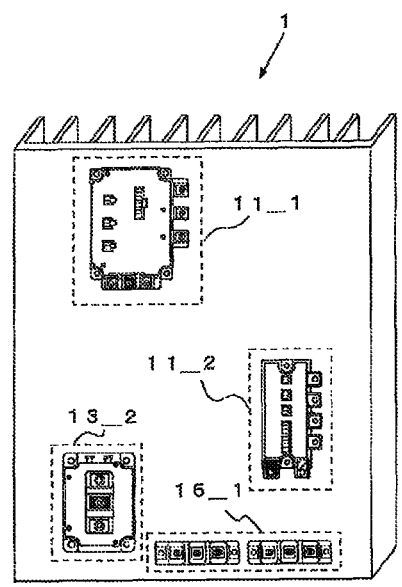
FIG. 6 illustrates an example of an arrangement configuration of various power conversion units in a case where a functionally-modularized form is not established.
Figure 7:
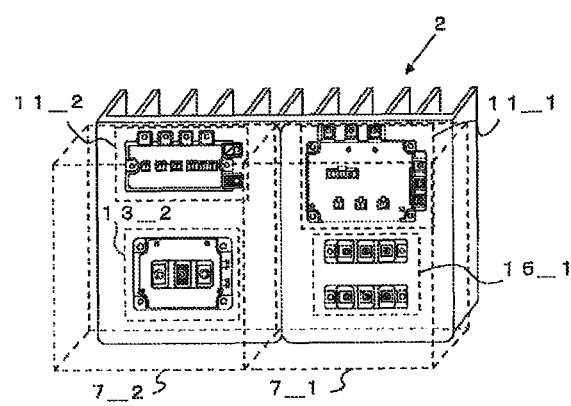
FIG. 7 illustrates an example of an arrangement configuration of various power conversion units in the case where a functionally-modularized form is established in Embodiment 1 of the present invention.

Specifically, FIG. 6 illustrates an example of a power conversion apparatus in a case where a functionally-modularized form is not established. FIG. 7 illustrates an example of the power conversion apparatus in Embodiment 1 of the present invention. A power conversion apparatus 1 illustrated in FIG. 6 includes semiconductor components configured to convert power necessary for all railway vehicles. On the other hand, the power conversion apparatus 2 illustrated in FIG. 7 is constituted by, for example, a combination of two functional modules 7_1 and 7_2, and thereby converts power necessary for all railway vehicles.

For example, in the power conversion apparatus 1 in the case where a functionally-modularized form is not established, the inverter unit 11_1, the inverter unit 11_2, the converter unit 13_2, and the rectifier unit 15_1 are mounted on the heat receiving section 43. The inverter unit 11_1, the inverter unit 11_2, the converter unit 13_2, and the rectifier unit 15_1 are arranged in such a manner as to leave a certain distance between each other in view of radiation characteristics of heat from each semiconductor component. Hence, in the power conversion apparatus 1, no consideration is given to optimization of dimensions. On the other hand, the power conversion apparatus 2 in the case where a functionally-modularized form is established is constituted by a combination of the functional module 7_1 and the functional module 7_2.

As illustrated in FIG. 6, in the power conversion apparatus 1 in the case where a functionally-modularized form is not established, since the power conversion units including the semiconductor components are arranged with no consideration for their sizes or dimensions, a large space is necessary. On the other hand, as illustrated in FIG. 7, in the power conversion apparatus 2 in the case where a functionally-modularized form is established, since the power conversion units are arranged with consideration for their sizes or dimensions, arrangement can be made in a small space. As an inverter unit to be combined with the converter unit 13_2, the inverter unit 11_3 other than the inverter unit 11_1 having the highest capacity among a plurality of inverter units 11_1 to 11_3 is selected and constitutes the functional module 7_1. Furthermore, since the amount of heat generated in the rectifier unit 15_1 is not very large, the inverter unit 11_1 having the highest capacity among the plurality of inverter units 11_1 to 11_3 is selected and can constitute the functional module 7_2. Although the case where there are two inverter units is illustrated in FIG. 2, if there are three or more inverter units, it is desirable that an inverter unit having the highest or second-highest capacity be selected and constitute the functional module 7_2. As a result, the amounts of heat generated in and the sizes of the respective functional modules can be nearly equal.

Figure 8:
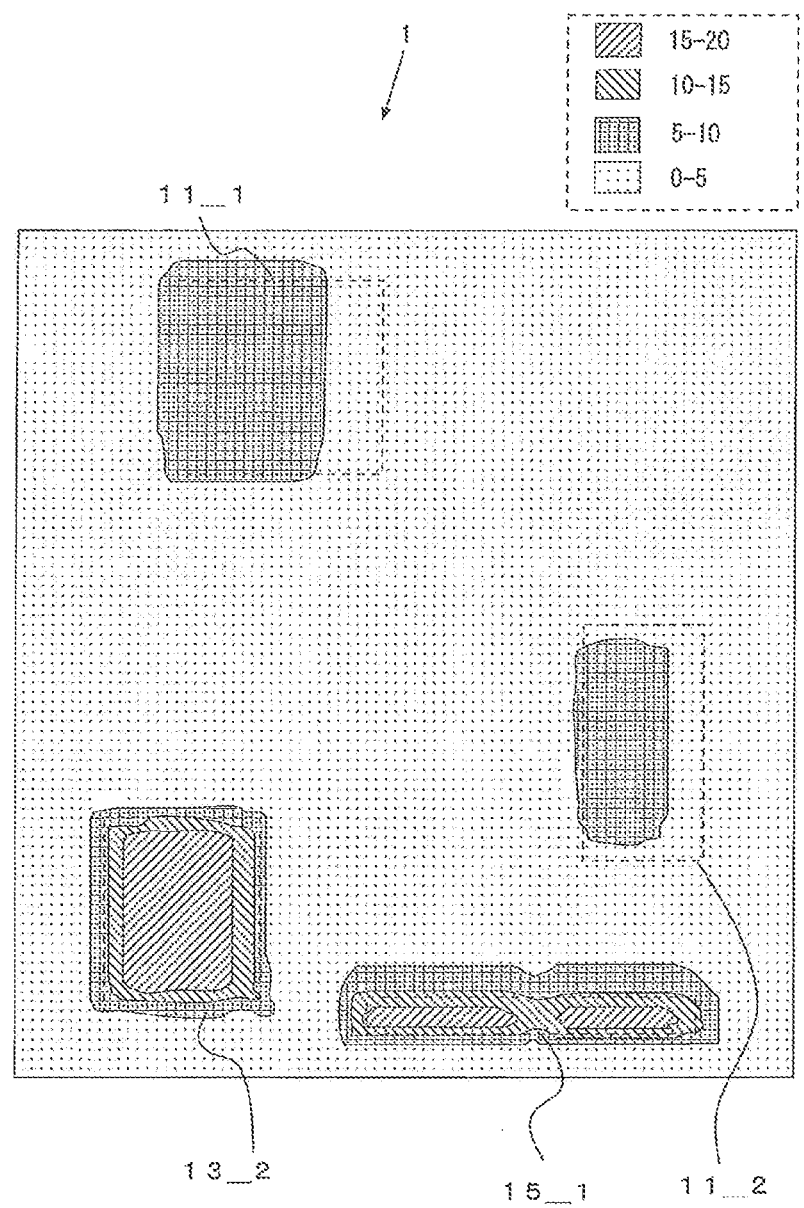
FIG. 8 illustrates an example of the configuration of distribution of heat generation in the case where a functionally-modularized form is not established.
Figure 9:
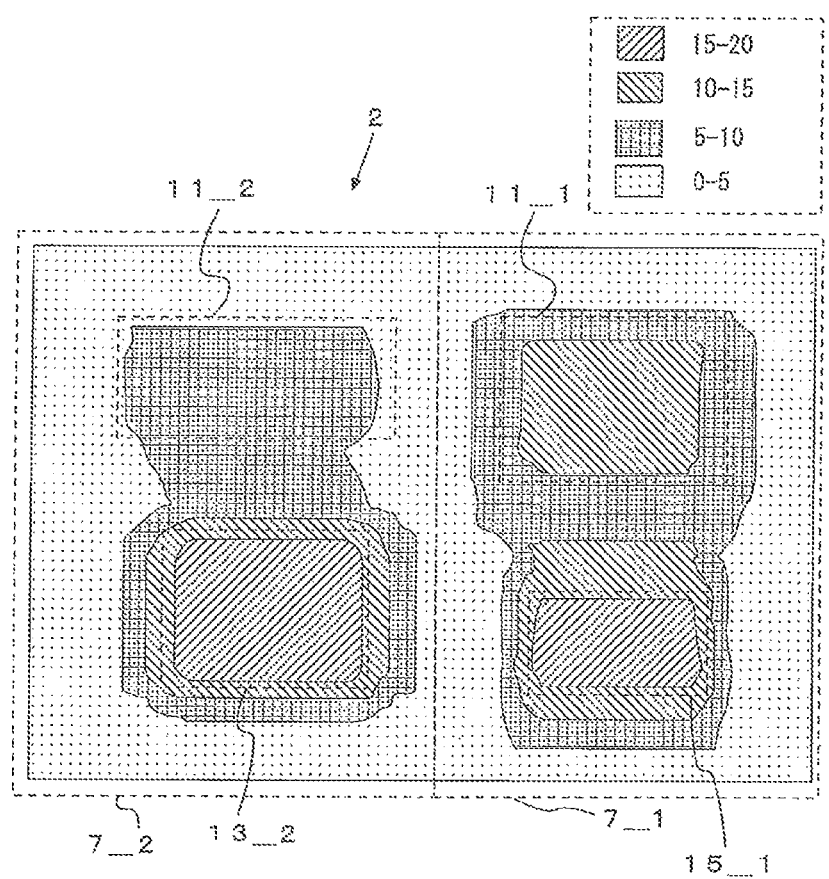
FIG. 9 illustrates an example of the configuration of distribution of heat generation in the case where a functionally-modularized form is established in Embodiment 1 of the present invention.

FIG. 8 illustrates an example of the configuration of distribution of heat generation in the case where a functionally-modularized form is not established in Embodiment 1 of the present invention. FIG. 9 illustrates an example of the configuration of distribution of heat generation in the case where a functionally-modularized form is established in Embodiment 1 of the present invention. As illustrated in FIG. 8, in the power conversion apparatus 1 in the case where a functionally-modularized form is not established, a region in which the amount of heat generated is high is smaller in size than a region in which the amount of heat generated is zero. As illustrated in FIG. 9, in the power conversion apparatus 2 in the case where a functionally-modularized form is established, a region in which the amount of heat generated is high is larger in size than a region in which the amount of heat generated is zero.

For example, in the power conversion apparatus 1 in the case where a functionally-modularized form is not established in FIG. 8, the amount of heat generated on an inverter unit 11_1 side is 5 to 10 W/cm$^2$, the range of the amount of heat generated on an inverter unit 11_2 side is 5 to 10 W/cm$^2$, the ranges of the amount of heat generated on a converter unit 13_2 side are 15 to 20 W/cm$^2$, 10 to 15 W/cm$^2$, and 5 to 10 W/cm$^2$ in the order from the center to the periphery, and the ranges of the amount of heat generated on a rectifier unit 15_1 side are 15 to 20 W/cm$^2$ on a left center side and a right center side, 10 to 15 W/cm$^2$ on the periphery of the regions of 15 to 20 W/cm$^2$, and 5 to 10 W/cm$^2$ on the periphery of the region of 10 to 15 W/cm$^2$.

On the other hand, in the power conversion apparatus 2 in the case where a functionally-modularized form is established in FIG. 9, in the functional module 7_1, the range of the amount of heat generated on an inverter unit 11_2 side is 5 to 10 W/cm$^2$, and the ranges of the amount of heat generated on a converter unit 13_2 side are 15 to 20 W/cm$^2$, 10 to 15 W/cm$^2$, and 5 to 10 W/cm$^2$ in the order from the center to the periphery. Additionally, in the functional module 7_2, the ranges of the amount of heat generated on an inverter unit 11_1 side are 10 to 15 W/cm$^2$ and 5 to 10 W/cm$^2$ in the order from the center to the periphery, and the ranges of the amount of heat generated on a rectifier unit 15_1 side are 15 to 20 W/cm$^2$, 10 to 15 W/cm$^2$, and 5 to 10 W/cm$^2$ in the order from the center to the periphery.

Figure 10:
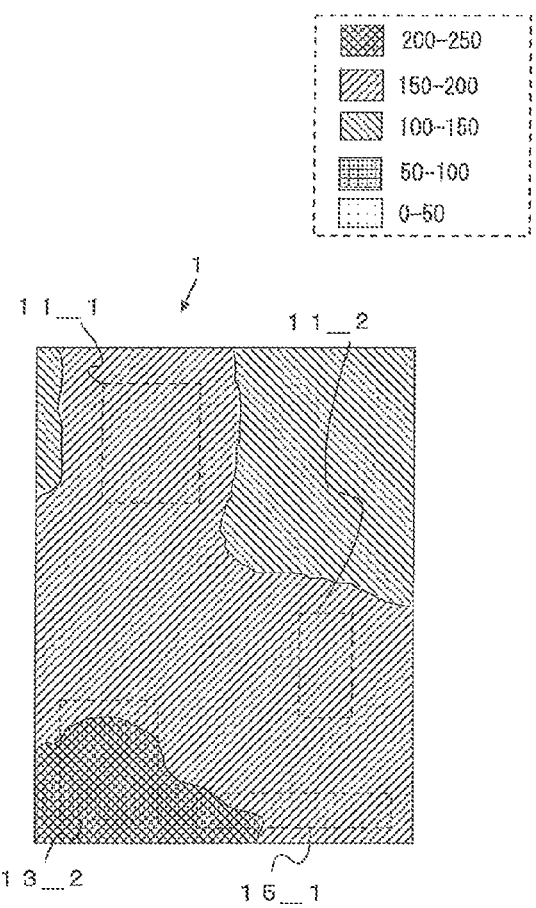
FIG. 10 illustrates an example of the configuration of temperature distribution in the case where a functionally-modularized form is not established.
Figure 11:
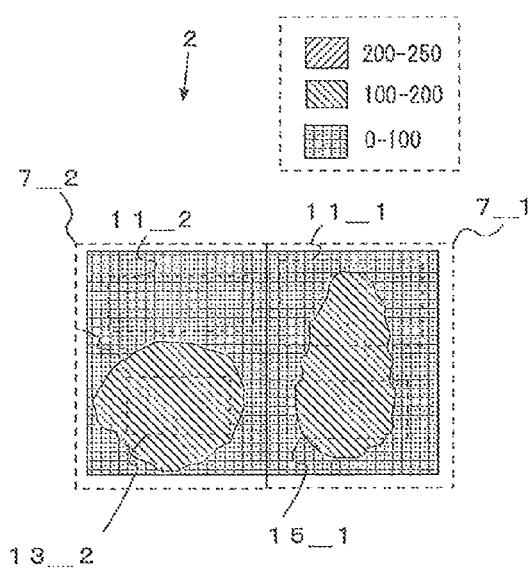
FIG. 11 illustrates an example of the configuration of temperature distribution in the case where a functionally-modularized form is established in Embodiment 1 of the present invention.

FIG. 10 illustrates an example of the configuration of temperature distribution in the case where a functionally-modularized form is not established. FIG. 11 illustrates an example of the configuration of temperature distribution in the case where a functionally-modularized form is established in Embodiment 1 of the present invention. As illustrated in FIG. 10, in the power conversion apparatus 1 in the case where a functionally-modularized form is not established, temperature tendencies are not nearly equal, whereas, as illustrated in FIG. 11, in the power conversion apparatus 2 in the case where a functionally-modularized form is established, temperature tendencies are nearly equal.

For example, in the power conversion apparatus 1 in the case where a functionally-modularized form is not established in FIG. 10, the temperature range of the region containing the inverter unit 11_1, the inverter unit 11_2, part of the rectifier unit 15_1, and part of the converter unit 13_2 is 150 to 200 degrees C., and the temperature range of the region containing part of the rectifier unit 15_1 and part of the converter unit 13_2 is 200 to 250 degrees C. That is, in this case, temperature tendencies are not equal. Additionally, the temperature range of the region containing no power conversion units is 100 to 150 degrees C.

On the other hand, in the power conversion apparatus 2 in the case where a functionally-modularized form is established in FIG. 11, on a functional module 7_1 side, the temperature range of the region containing the inverter unit 11_2 is 0 to 100 degrees C., and the temperature ranges of the region containing the converter unit 13_2 are 100 to 200 degrees C. and 0 to 100 degrees C., that is, the temperature ranges from 100 to 200 degrees C. to 0 to 100 degrees C. Additionally, on a functional module 7_2 side, the temperature ranges of the region containing the inverter unit 11_1 are 100 to 200 degrees C. and 0 to 100 degrees C. on a center side, that is, the temperature ranges from 100 to 200 degrees C. to 0 to 100 degrees C., and the temperature range on the periphery of the center side is 0 to 100 degrees C. The temperatures of the region containing the rectifier unit 15_1 are 100 to 200 degrees C. and 0 to 100 degrees C. on a center side, that is, the temperature ranges from 100 to 200 degrees C. to 0 to 100 degrees C., and the temperatures on the periphery of the center side are 0 to 100 degrees C. That is, in this case, the functional module 7_1 and the functional module 7_2 are nearly equal in all the temperature tendencies in the heat receiving section 43.

Hence, in the case where cooling is carried out by using the cooler 6, such as a heat sink, in the power conversion apparatus 1 in FIG. 1, there are many regions in which cooling is unnecessary, and heat is locally conducted to the cooler 6, thus reducing the cooling efficiency of the cooler 6. On the other hand, in the power conversion apparatus 2 in FIG. 7, heat is conducted to the entire base plate (the entire cooler 6), thus enabling an increase in the cooling efficiency of the cooler 6. As a result, in the power conversion apparatus 2 in the case where a functionally-modularized form is established, optimization of dimensions is achieved, and also radiation characteristics of heat are improved.

Furthermore, in each of the functional modules 7_1 to 7_3, a plurality of power conversion units are arranged so that the amounts of heat generated are balanced, and thus radiation characteristics of heat and optimization of dimensions are improved. That is, when the arrangement configuration of the power conversion units is designed without increasing the size of a case, radiation characteristics of heat are improved, and when the power converter 5 is implemented on a function-by-function basis for each of the functional modules 7_1 to 7_3, shared use of components can be made, and thus optimization of dimensions is improved.

In other words, as for heat, the cooler 6 can efficiently conduct and transfer heat, and the size of the cooler 6 can be reduced. Furthermore, as for electricity, the size of a snubber circuit and the number of snubber circuits can be reduced, and a reduction in size and weight of the power conversion apparatus 2 can be achieved.

From the above description, in the power conversion apparatus 2, with the inverter units 11_1 to 11_4, and the converter unit 13_2, power conversion units in which the respective amounts of heat generated are different are alternately provided. As a result, the power conversion apparatus 2 enables the cooler 6 to spread heat generated in power conversion units. For this reason, the power conversion apparatus 2 enables the power conversion units in which the respective amounts of heat generated are different and that are provided for each of the functional modules 7_1 to 7_3 to be efficiently cooled. Furthermore, the power conversion apparatus 2 enables the size of the cooler 6 to be kept to a minimum necessary because only the cooling fans 23 of the same specifications are necessary. Hence, the power conversion apparatus 2 enables reductions in size and weight of apparatus components to be promoted.

In particular, when the functional modules 7_1 to 7_3 are each cooled by the cooler 6, the cooler 6 can be used effectively, and thus respective cooling mechanisms do not have to be provided, the size of the cooler 6 can be kept to a minimum necessary, and the semiconductor components can be cooled effectively.

Embodiment 2

Configuration in Embodiment 2

In Embodiment 2, a detailed configuration of the cooler 6 will be described. FIG. 12 illustrates an example of a location relationship between the functional modules 7_2 and 7_3 and the cooler 6 in Embodiment 2 of the present invention. Note that the power converter 5 in FIG. 12 is constituted by a combination of the functional module 7_2 and the functional module 7_3. As illustrated in FIG. 12, the cooler 6 is a heat sink, for example, and includes the heat radiating section 41 and the heat receiving section 43. The heat receiving section 43 is formed of a member having a plane, the above-described functional modules 7_2 and 7_3 are each provided in such a manner as to be in contact with the heat receiving section 43, and thus heat generated in power conversion units provided in each of the functional modules 7_2 and 7_3 is conducted to the heat radiating section 41 via the heat receiving section 43. The heat radiating section 41 includes a plurality of heat radiating fins 45. The heat radiating fins 45 are formed in the same direction as the cooling fans 23 send air. The heat radiating section 41 transfers, from the heat radiating fins 45, heat conducted via the heat receiving section 43.

For example, an example in which the functional module 7_2 and the functional module 7_3 are provided on the heat receiving section 43 will be described. In the functional module 7_3, a power conversion unit in which the amount of heat generated is small, for example, the inverter unit 11_4 is disposed at a position corresponding to a downstream side of the cooler 6, and a power conversion unit in which the amount of heat generated is large, for example, the inverter unit 11_3 is disposed at a position corresponding to an upstream side of the cooler 6. In the functional module 7_2, a power conversion unit in which the amount of heat generated is small, for example, the inverter unit 11_2 is disposed at a position corresponding to the downstream side of the cooler 6, and a power conversion unit in which the amount of heat generated is large, for example, the converter unit 13_2 is disposed at a position corresponding to the upstream side of the cooler 6.

Here, the cooler 6 is vertically provided, the heat receiving section 43 is provided on a closed chamber side, and the heat radiating section 41 is provided on an open chamber side. As a result of this arrangement configuration, outside air does not come into contact with electrical components, such as power conversion units, and a charging section, which is not illustrated, directly.

Furthermore, a power conversion unit in which the amount of heat generated is small is provided on the downstream side of the cooler 6, a power conversion unit in which the amount of heat generated is large is provided on the upstream side of the cooler 6, and the cooler 6 is vertically provided, and thus natural convection occurs in the cooler 6, the amounts of heat generated are also balanced in each of the functional modules 7_2 and 7_3, and the balance of temperature distribution is kept.

Effects in Embodiment 2

From the above description, in the power conversion apparatus 2, the heat receiving section 43 is provided at a position being in contact with the closed chamber 8, and the heat radiating section 41 is provided in the open chamber 9 that communicates with outside air. Hence, the power conversion apparatus 2 does not cause outside air to come into contact with electrical components, such as power conversion units, and a charging section, which is not illustrated, directly. As a result, the power conversion apparatus 2 can ensure the reliability of electrical components, such as power conversion units.

Furthermore, since, for example, a plurality of inverter units 11_2 to 11_4 and the converter unit 13_2 are provided in the functional modules 7_2 and 7_3, the power conversion apparatus 2 causes the cooler 6 to spread heat generated in power conversion units. Hence, the power conversion apparatus 2 enables a temperature gradient in the heat receiving section 43 to be reduced from a sharp state to a gentle state.

Furthermore, in the power conversion apparatus 2, the heat receiving section 43 of the cooler 6 including power conversion units mounted in the same plane thereof is vertically provided, a power conversion unit in which the amount of heat generated is small is disposed on the downstream side of the cooler 6, and a power conversion unit in which the amount of heat generated is large is disposed on the upstream side of the cooler 6. Hence, in the heat receiving section 43 of the cooler 6, the flow of air is formed so that air flows vertically upward.

Furthermore, in the heat receiving section 43, heat is generated with the amount of heat generated being small on the downstream side of the cooler 6, heat is generated with the amount of heat generated being large on the upstream side of the cooler 6, and thus temperature tendencies in the heat receiving section 43 are kept nearly equal. Under this condition, the cooling fans 23 are actuated, and thus natural convection can be used, and also the same flow of cooling air efficiently cools the power conversion units in which the respective amounts of heat generated are different. Additionally, the heat radiating fins 45 of the heat radiating section 41 are formed in the same direction as the cooling fans 23 send air. For all of these reasons, an entire cooling mechanism is simplified.

From the above, in Embodiment 2, in the power conversion apparatus 2, the heat receiving section 43 can be provided at a position being in contact with the closed chamber 8, and the heat radiating section 41 can be provided in the open chamber 9 that communicates with outside air. Hence, the power conversion apparatus 2 does not cause outside air to come into contact with electrical components, such as power conversion units, and a charging section, which is not illustrated, directly. As a result, the power conversion apparatus 2 can ensure the reliability of electrical components, such as power conversion units.

Note that, although the case where the power converter 5 is constituted by a combination of two functional modules 7_2 and 7_3 is illustrated in Embodiment 2, the number and types of functional modules are not limited to this, the power converter 5 may be constituted by, for example, one functional module (see FIGS. 5A to 5C), or a combination of two or more functional modules (see FIGS. 3A to 3C and FIGS. 4A to 4C).

Embodiment 3

Configuration in Embodiment 3

In Embodiment 3, an example in which the power conversion apparatus 2 is provided in a railway vehicle 51 will be described. FIG. 13 illustrates an example of the railway vehicle 51 in which the power conversion apparatus 2 is installed in Embodiment 4 of the present invention. As illustrated in FIG. 13, the railway vehicle 51 includes a pantograph 71, a transformer 72, an auxiliary power supply device 73, an air-conditioning unit 74, and other devices. Note that power may be supplied to the air-conditioning unit 74 from the auxiliary power supply device 73 via a power supply line 76, for example.

The pantograph 71 is in contact with an overhead line 61, and electricity is therefore supplied to the railway vehicle 51 from the overhead line 61 via the pantograph 71. The overhead line 61 supplies electricity, examples of which include DC 600 V, DC 750 V, DC 1500 V, AC 20 kV, and AC 25 kV, to the railway vehicle 51. That is, the overhead line 61 is a main circuit that supplies high-voltage electricity, and various circuits or other circuits included in the railway vehicle 51 are auxiliary circuits that operate using low-voltage electricity. Thus, the auxiliary power supply device 73 reduces high-voltage electricity supplied from the overhead line 61 to low-voltage electricity, and supplies the low-voltage electricity to the auxiliary circuits.

Assume that the railway vehicle 51 runs using a direct-current voltage of DC 1500 V as power via, for example, the pantograph 71. In this case, the railway vehicle 51 converts the direct-current voltage into a low-voltage direct-current voltage, for example, a voltage of a DC 600 V class by using the power conversion apparatus 2. Additionally, the railway vehicle 51 supplies an alternating-current voltage converted by the auxiliary power supply device 73, for example, a voltage of a single-phase AC 400 V class, to an air-conditioning apparatus 81.

Furthermore, assume that the railway vehicle 51 runs using an alternating-current voltage of AC 25 kV as power. In this case, the railway vehicle 51 converts an alternating-current voltage reduced in voltage by the transformer 72, for example, a voltage of a single-phase AC 400 V class, into a direct-current voltage, for example, a voltage of a DC 600 V class by using the power conversion apparatus 2.

The air-conditioning unit 74 includes, for example, the power conversion apparatus 2 and the air-conditioning apparatus 81. The air-conditioning apparatus 81 includes, for example, heat exchangers 91, compressors 92, an outdoor air-sending device 93, and indoor air-sending devices 94. They are connected using refrigerant pipes, which are not illustrated, to form a refrigerant circuit, refrigerant circulates in the refrigerant circuit, and thus a refrigeration cycle is formed.

The power conversion apparatus 2 is constituted by a plurality of functional modules 7_1 to 7_3, the capacitor unit 4, the cooling fans 23, and other elements. The plurality of functional modules 7_1 to 7_3 are each allocated for each load included in the air-conditioning apparatus 81, and each supply alternating-current power of a different frequency so that loads are actuated at respective different rotation speeds.

Specifically, power conversion units included in the plurality of functional modules 7_1 to 7_3 are allocated to loads, such as the compressors 92, the outdoor air-sending device 93, and the indoor air-sending devices 94, included in the air-conditioning apparatus 81. A power conversion unit to which a compressor 92 is allocated supplies alternating-current power of a different frequency so that the compressor 92 is actuated at a rotation speed corresponding thereto. Similarly, a power conversion unit to which the outdoor air-sending device 93 is allocated supplies alternating-current power of a different frequency so that the outdoor air-sending device 93 is actuated at a rotation speed corresponding thereto. Similarly, a power conversion unit to which an indoor air-sending device 94 is allocated supplies alternating-current power of a different frequency so that the indoor air-sending device 94 is actuated at a rotation speed corresponding thereto.

Furthermore, in each of the plurality of functional modules 7_1 to 7_3, power conversion units corresponding to different loads are included, and the number and arrangement of power conversion units included in each of the functional modules 7_1 to 7_3 are decided upon so that the amounts of heat generated are distributed for each of the functional modules 7_1 to 7_3. Hence, with one power conversion apparatus 2, a plurality of power conversion units corresponding to different loads are provided, and also radiation characteristics of heat and optimization of dimensions in the power conversion apparatus 2 are improved. That is, although a different power supply has to be normally prepared for each different load, with one power conversion apparatus 2, shared use of structural components of a power supply is made.

Effects in Embodiment 3

From the above description, the power conversion apparatus 2 supplies alternating-current power of a different frequency for each different load. Thus, for example, shared use of structural components of the power conversion apparatus 2 serving as a power supply that actuates a plurality of compressors 92, the outdoor air-sending device 93, a plurality of indoor air-sending device 94, and other devices is made. Hence, restrictions on the arrangement of devices constituting the air-conditioning apparatus 81 installed in the railway vehicle 51 are eased.

As a result, the arrangement configuration of the outdoor air-sending device 93, the indoor air-sending devices 94, and the heat exchangers 91 are designed optimally, and thus necessary cooling capacity and heating capacity can be obtained.

Furthermore, when the power conversion apparatus 2 is provided in the railway vehicle 51, shared use of components is promoted, and thus the power conversion apparatus 2 can prevent a reduction in reliability due to an increase in the number of components.

From the above, in Embodiment 3, in the power conversion apparatus 2, the plurality of functional modules 7_1 to 7_3 are each allocated for each load included in the air-conditioning apparatus 81, and each supply alternating-current power of a different frequency for each load.

Because of the above-described configuration, the power conversion apparatus 2 enables shared use of structural components of the power conversion apparatus 2 serving as a power supply that actuates, for example, the plurality of compressors 92, the outdoor air-sending device 93, the plurality of indoor air-sending device 94, and other devices.

Embodiments of the present invention are not limited to Embodiments described above. For example, although, in Embodiments described above, the case where two power conversion units are mounted in each of the functional modules 7_1 to 7_3 is illustrated, one power conversion unit may be mounted, or three or more power conversion units may be mounted. Additionally, in the functional modules 7_1 to 7_3, a unit for other use, such as a microprocessor, may be installed together with a power conversion unit as long as a unit having a function of converting power is installed. Furthermore, although the case where the cooler 6 performs cooling using an air-cooled method is illustrated, any method in which the functional modules 7_1 to 7_3 are cooled, for example, a known technique, such as a water-cooled method, can be used.

REFERENCE SIGNS LIST 1 power conversion apparatus in the case where a functionally-modularized form is not established 2 power conversion apparatus in the case where a functionally-modularized form is established 4 capacitor unit 5 power converter 6 cooler 7_1, 7_2, 7_3 functional module 8 closed chamber 9 open chamber 11_1, 11_2, 11_3, 11_4 inverter unit 13_2 converter unit 15_1 rectifier unit 21 cooling fan unit 23 cooling fan 41 heat radiating section 43 heat receiving section 45 heat radiating fin 50 accommodating section 51 railway vehicle 61 overhead line 71 pantograph 72 transformer 73 auxiliary power supply device 74 air-conditioning unit 76 power supply line 81 air-conditioning apparatus 91 heat exchanger 92 (CP) compressor 93 (CF) outdoor air-sending device 94 (EF) indoor air-sending device

The invention claimed is:

1. A power conversion apparatus configured to supply power to an air-conditioning apparatus provided in a railway vehicle, the power conversion apparatus comprising:

a power converter including plurality of power conversion units each constituted by a semiconductor component and configured to convert power, wherein the power conversion units are separated into a plurality of functional modules;

a cooler configured to contact with the semiconductor component mounted in each of the functional modules to cool the semiconductor component; and an accommodating section accommodating the power converter and the cooler, wherein the functional modules include two or more of:

a functional module including a rectifier unit configured to rectify an alternating-current voltage externally supplied and an inverter unit configured to convert a direct-current voltage into alternating-current power,
a functional module including a converter unit configured to convert an alternating-current voltage into a direct-current voltage and an inverter unit configured to convert a direct-current voltage converted by the converter unit into alternating-current power, and
a functional module including an inverter unit configured to convert a direct-current voltage into alternating-current power,
wherein the accommodating section includes:
a closed chamber sealing off the power converter, and
an open chamber with an opening through which heat transferred by the cooler is transferred to outside air,
wherein the cooler includes:
a heat receiving section provided on a closed chamber side and receiving heat generated from the functional modules, and
a heat radiating section provided on an open chamber side and transferring heat received by the heat receiving section,
wherein the heat radiating section includes a plurality of heat radiating fins,
wherein a cooling fan blows air vertically upward toward the plurality of heat radiating fins, and
wherein one of the two power conversion units in which an amount of heat generated is large is disposed vertically under another of the two power conversion units in which the amount of heat generated is small.

2. The power conversion apparatus of claim 1,
wherein the power converter includes a corresponding number of the inverter units to at least one device included in the air-conditioning apparatus.

3. The power conversion apparatus of claim 1, wherein each functional module includes conductors connecting the semiconductor components at locations facing each other.

4. The power conversion apparatus of claim 1, further comprising:
a capacitor unit configured to store power,
wherein the functional modules are mounted on the capacitor unit in such a manner as to be demountable from the capacitor unit.

* * * * *